United States Patent [19]
Chokhawala et al.

[11] Patent Number: 5,444,591
[45] Date of Patent: Aug. 22, 1995

[54] IGBT FAULT CURRENT LIMITING CIRCUIT

[75] Inventors: Rahul S. Chokhawala; Jamie P. Catt, both of Redondo Beach, Calif.

[73] Assignee: International Rectifier Corporation, El Segundo, Calif.

[21] Appl. No.: 40,212

[22] Filed: Apr. 1, 1993

[51] Int. Cl.⁶ .................................................. H02H 7/10
[52] U.S. Cl. ............................................ 361/18; 361/56; 361/91
[58] Field of Search .................... 361/18, 56, 111, 91, 361/58

[56] References Cited

U.S. PATENT DOCUMENTS

| | | | |
|---|---|---|---|
| 4,719,531 | 1/1988 | Okado et al. | 361/86 |
| 4,893,158 | 1/1990 | Mihara et al. | 361/91 |
| 5,303,110 | 4/1994 | Kumagai | 361/18 |

*Primary Examiner*—Todd DeBoer
*Attorney, Agent, or Firm*—Ostrolenk, Faber, Gerb & Soffen

[57] ABSTRACT

A circuit for improving the short circuit withstand capability of an IGBT. The circuit utilizes a MOSFET which, when turned on, reduces the voltage applied to the gate of the IGBT during a short circuit condition, thereby lowering the short circuit current passing through the IGBT. A Zener diode is coupled between the MOSFET and the gate of the IGBT to clamp the voltage of the gate of the IGBT to a predetermined voltage when the MOS transistor is turned on during a short circuit condition. The circuit turns the MOSFET on when the voltage at the collector of the IGBT rises during a short circuit condition. If tile fault is of a short, transient type, the circuit advantageously restores the normal gate voltage. The circuit draws a small current from the gate driver and requires no separate DC source, making it feasible to insert the circuit in IGBT modules or connect the circuit as an interface between the gate driver and the gate.

14 Claims, 7 Drawing Sheets

FIG. 1 PRIOR ART

ON-STATE VOLTAGE DROP IN VOLTS

PERMISSIBLE SHORT CIRCUIT TIME IN $\mu s$

FIG. 4

$t_{sc} = f(1/I_{sc})$
$t_{sc} = f(1/V_g)$ $V_G$ IN VOLTS

IGBT FAULT CURRENT LIMITING CIRCUIT

BACKGROUND OF THE INVENTION

1. Field of the Invention:

The present invention relates to a circuit for improving the short circuit withstand capability of an insulated gate bipolar transistor (IGBT).

2. Description of the Related Art:

Power transistors are used in electrical equipment to control and convert electrical power. The objective is achieved by switching these devices on and off, at predetermined instances. The devices are selected by system designers to reliably handle circuit currents under normal as well as estimated overload conditions. However, under fault or short circuit conditions, a device may be subjected to very high surge currents, the magnitude of which is limited mainly by its own gain. Only timely control and removal of fault current, by some external means, will save such device from failure.

In applications where system fault is very real, the motor-drive market being the prime example, external protection circuits are used to sense the fault and turn off the transistor by shutting down the base/gate drive. In all such applications, except where "intelligent" modules are used, the protection circuit is connected externally to the device.

Figure 1:
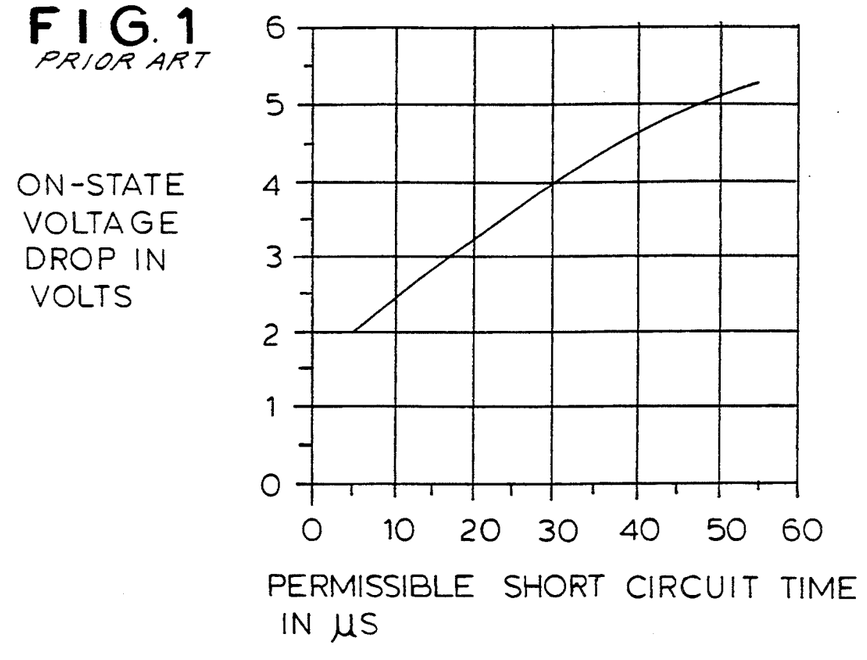
FIG. 1 is a graph showing the tradeoff between permissible short circuit time versus on-state voltage drop across an IGBT.

Consequently, device manufacturers are expected to guarantee minimum short-circuit withstand time—a measure of how long a device will survive fault current. A device tradeoff exists between the short circuit withstand time and the current-gain of the power transistors. That is, the higher the gain of the transistor, the higher will be the fault current magnitude and the shorter will be the short circuit withstand time. The tradeoff, illustrated in FIG. 1, is more important for IGBT transistor manufacturers due to the inherently higher gain of these devices. The low-gain IGBTs available today allow longer short circuit time, but at the expense of operating efficiency. The high gain devices, on the other hand, boast greater efficiency, but require quicker external protection circuits.

The present market trend is to improve system efficiency. This, in turn, translates to demand for high efficiency IGBTs. The requirement for longer short circuit time (10 us) is still prevalent, especially for the existing designs. There is thus a pressing need for high efficiency (higher gain), long short circuit time IGBTs. The inherent device tradeoff, however, does not allow IGBTs to have it both ways.

Figure 2:
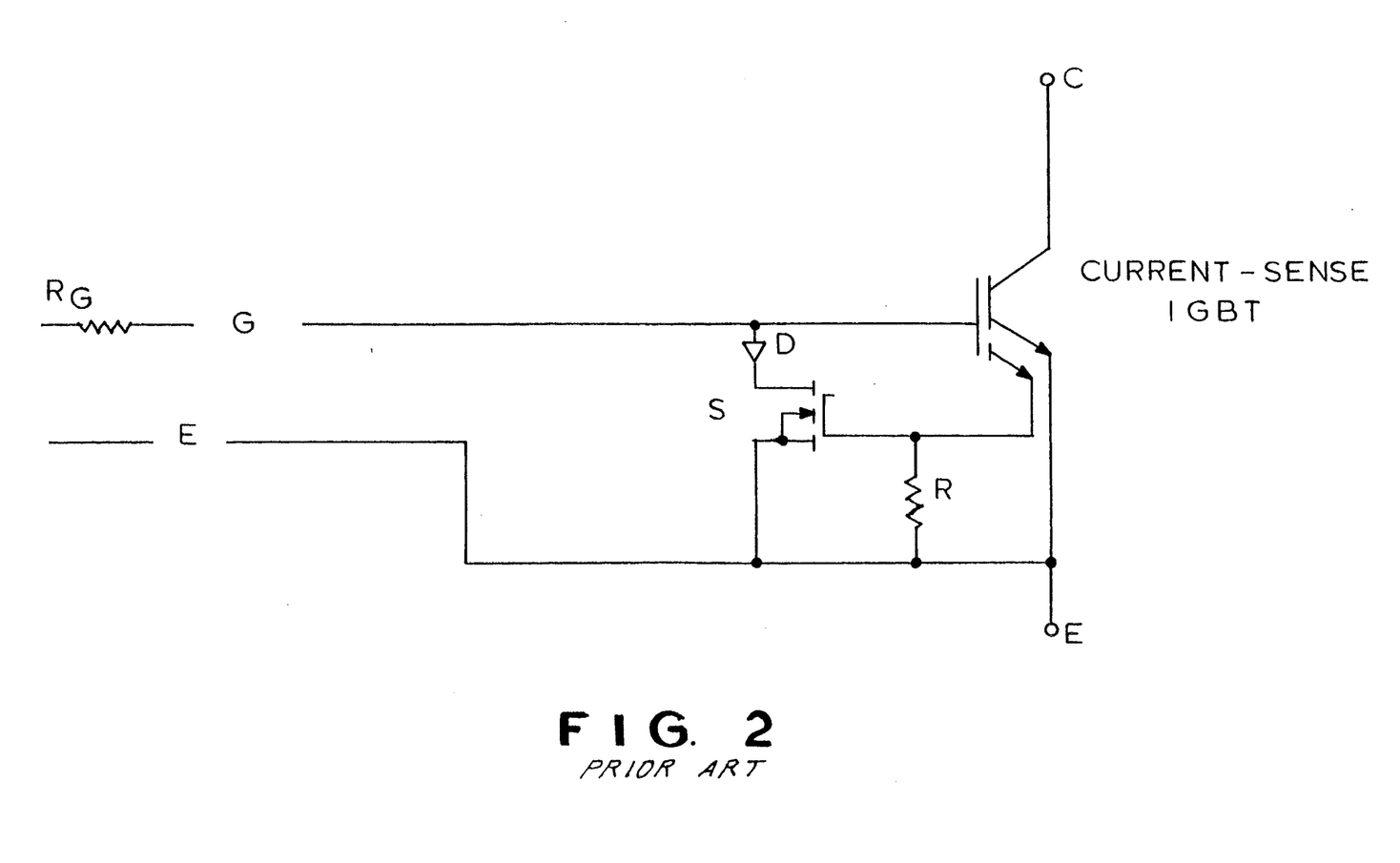
FIG. 2 shows a prior art protection circuit utilizing a current-sense IGBT.

Prior solutions for protecting IGBTs have been devised, but are not entirely satisfactory. For example, the prior art circuit shown in FIG. 2 uses a current sense IGBT to monitor the IGBT current. If the device current exceeds the preset value, the voltage developed across the sense-resistor R1 rises above the MOSFET's gate-threshold level. As the MOSFET starts to conduct, a voltage drop is developed across external series gate resistor $R_G$. The IGBT gate voltage is accordingly reduced and the device current is regulated. The limitation of this circuit is that it can only be used with current-sense IGBTs. The cost effectiveness of manufacturing current-sense IGBTs and problems related to controlling tolerances in the current-sense ratio are major considerations. The vast majority of IGBTs used today in power modules are not of the current-sense type. Also, this circuit cannot be "plugged" externally to an IGBT module unless current-sense terminals are brought outside, a difficult task since this may render the circuit sensitive to system noise. Moreover, the circuit dependency on the value of $R_G$ compromises the IGBT turn-on losses.

Figure 3:
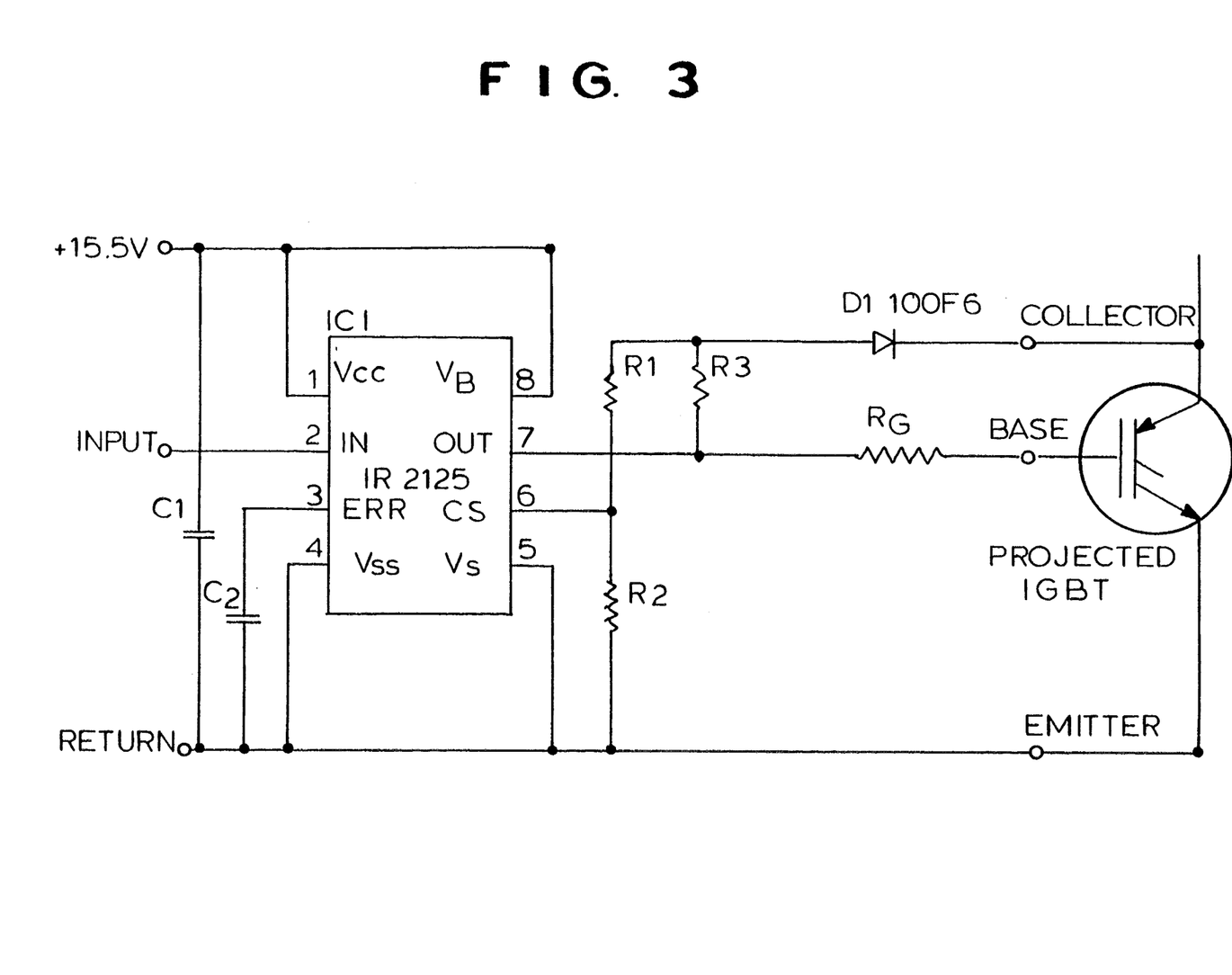
FIG. 3 shows a prior art circuit which uses a power IC to monitor the collector to emitter voltage of the protected IGBT.

The prior art circuit shown in FIG. 3 makes use of power ICs with a sense feature. The circuit monitors collector to emitter voltage to sense the fault. This circuit has built-in delays to allow for turn-on switching and narrow load current spikes. A fault condition lasting for longer than the above-described delay, however, is greeted with complete IGBT shutdown. The circuit has no provision to: 1) limit the initial high peak of fault current; or, 2) keep limiting the fault current, while restoring normal gate drive if the fault is of a short, transient type. The other disadvantage of this circuit is that it requires a DC voltage supply to operate. Thus, it cannot be simply inserted inside the existing modules.

Accordingly, a need exists for a circuit which improves the short circuit withstand capability of IGBTs without the above-noted disadvantages of the prior art.

SUMMARY OF THE INVENTION

Figure 4:
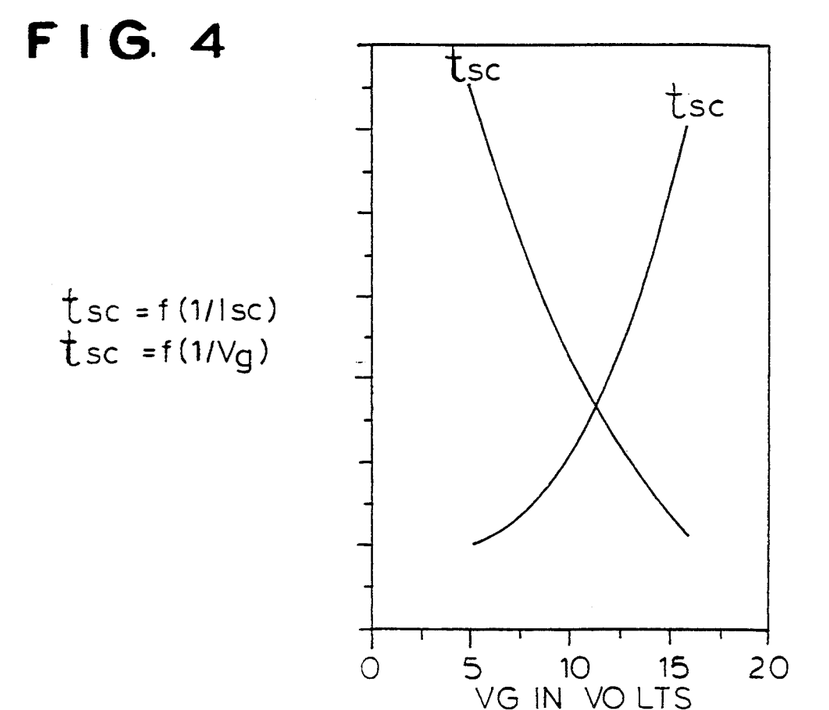
FIG. 4 is a graph showing that the short-circuit withstand capability of an IGBT improves with lower gate voltages.

The circuit of the present invention achieves the above-noted objective. The circuit takes advantage of the fundamental characteristics of IGBTs, related to the dependency of short circuit withstand time on the gate voltage. As shown in FIG. 4, lowering the gate voltage to an IGBT lowers the magnitude of fault current and prolongs short circuit endurance time.

Accordingly, the circuit of the present invention operates by sensing the fault and subsequently lowering the gate voltage. Lower gate voltage limits magnitude of the fault current and in doing so extends the short circuit withstand time. A built-in time delay is introduced to allow for the switching transients or load current spikes.

More specifically, the circuit of the present invention comprises a MOSFET for reducing the voltage applied to the gate of the IGBT during a short circuit condition, thereby lowering the short circuit current passing through the IGBT. A Zener diode is coupled between the MOSFET and the gate of the IGBT for clamping the voltage of the gate of the IGBT to a predetermined voltage when the MOSFET is turned on during a short circuit condition.

The circuit of the present invention operates by applying an increased voltage to the gate of the MOSFET to turn the MOSFET on during a short circuit condition when the voltage at the collector of the IGBT rises, thereby clamping the gate of the IGBT at the predetermined voltage. A potential divider is coupled between the gate of the IGBT and the gate of the MOSFET, and a diode is coupled between the potential divider and the collector of the IGBT. The diode is oriented so as to be rendered non-conductive during a short circuit condition when the voltage at the collector of the IGBT rises, resulting in an increased voltage at the gate of the MOSFET as current is prevented from passing through the diode and is diverted to the potential divider. The current diverted to the potential divider is generated from the voltage supplied to the gate of the IGBT.

Optionally, an additional MOSFET and an additional potential divider may be coupled between the gate of the IGBT and the diode to turn the IGBT off completely if the short circuit condition lasts longer than a predetermined time interval. Also optionally, a diode may be provided between the source of the additional MOSFET and ground as an error flag for indicating a short circuit condition. Also optionally, a Zener diode may be coupled between the gate of the MOSFET and the potential divider to make the circuit more or less insensitive to variations in the on-state voltage drop of the IGBT and eliminate the need to select the MOSFET according to its gate-threshold voltage.

Other features and advantages of the present invention will become apparent from the following description of the preferred embodiments with reference to the accompanying drawings.

DETAILED DESCRIPTION OF THE PREFERRED EMBODIMENTS

Figure 5:
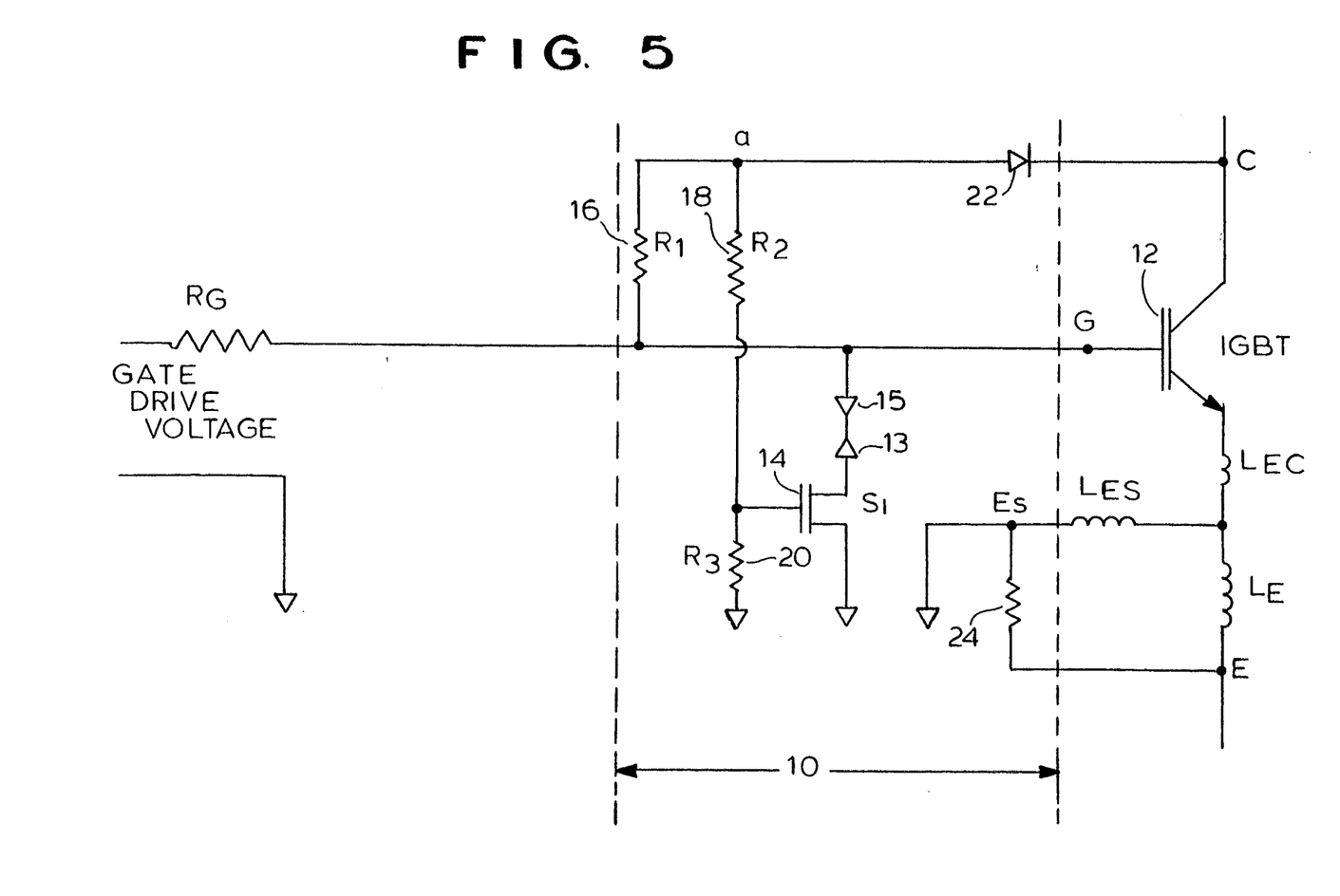
FIG. 5 shows the protection circuit of the present invention.

Referring to FIG. 5, the circuit of the present invention is contained within the dashed lines identified by reference numeral 10. The IGBT to be protected by circuit 10 is identified by reference numeral 12.

Circuit 10 includes a MOSFET 14 with its drain coupled to the gate G of IGBT 12 through opposing Zener diodes 13, 15. The gate of MOSFET 14 is coupled to the gate of IGBT 12 through a potential divider consisting of resistors 16, 18 and 20 having values R1, R2 and R3 respectively. These resistors are selected such that the percentage of the gate voltage applied to MOSFET 14 is ordinarily low enough to avoid turn-on of MOSFET 14. In its off state, MOSFET 14 has no effect on the gate voltage applied to IGBT 12.

Point a, between resistors 16 and 18, is coupled to the collector C of IGBT 12 via a diode 22.

If a fault occurs while IGBT 12 is in conduction, considered to be the worst case, the voltage across it rapidly rises towards the DC rail voltage and diode 22 becomes reverse biased. The gate drive now starts to charge the input capacitance of MOSFET 14 at a rate determined by time constant (R1+R2)C, C being the input capacitance of MOSFET. The potential divider, formed by (R1+R2) and R3, drives MOSFET 14 into conduction. By adjusting the values of the resistors, the time constant can be set to avoid false triggering by switching transients. Zener diode 15 allows for the negative gate bias voltage to be applied.

A resistor 24 is provided for negative feedback in the gate-emitter loop. $L_E$ and $L_{ES}$ are the inherent lead inductances of main emitter and emitter sense connections, respectively. During a fault, a voltage proportional to the fault current di/dt is induced across $L_E$. By inserting resistor 24 between points E and Es, a potential divider is formed across $L_E$. The voltage drop in $L_{ES}$, during fast rise in the fault current, instantaneously reduces the IGBT gate-emitter voltage. This action limits the rate of rise of fault current and lowers its peak value. The value of resistor 24 must be selected carefully in order to minimize its impact on normal switching. Nevertheless, any adverse effects on IGBT switching performance can be easily counterbalanced by adjusting the value of external series gate resistor $R_G$.

Figure 6:
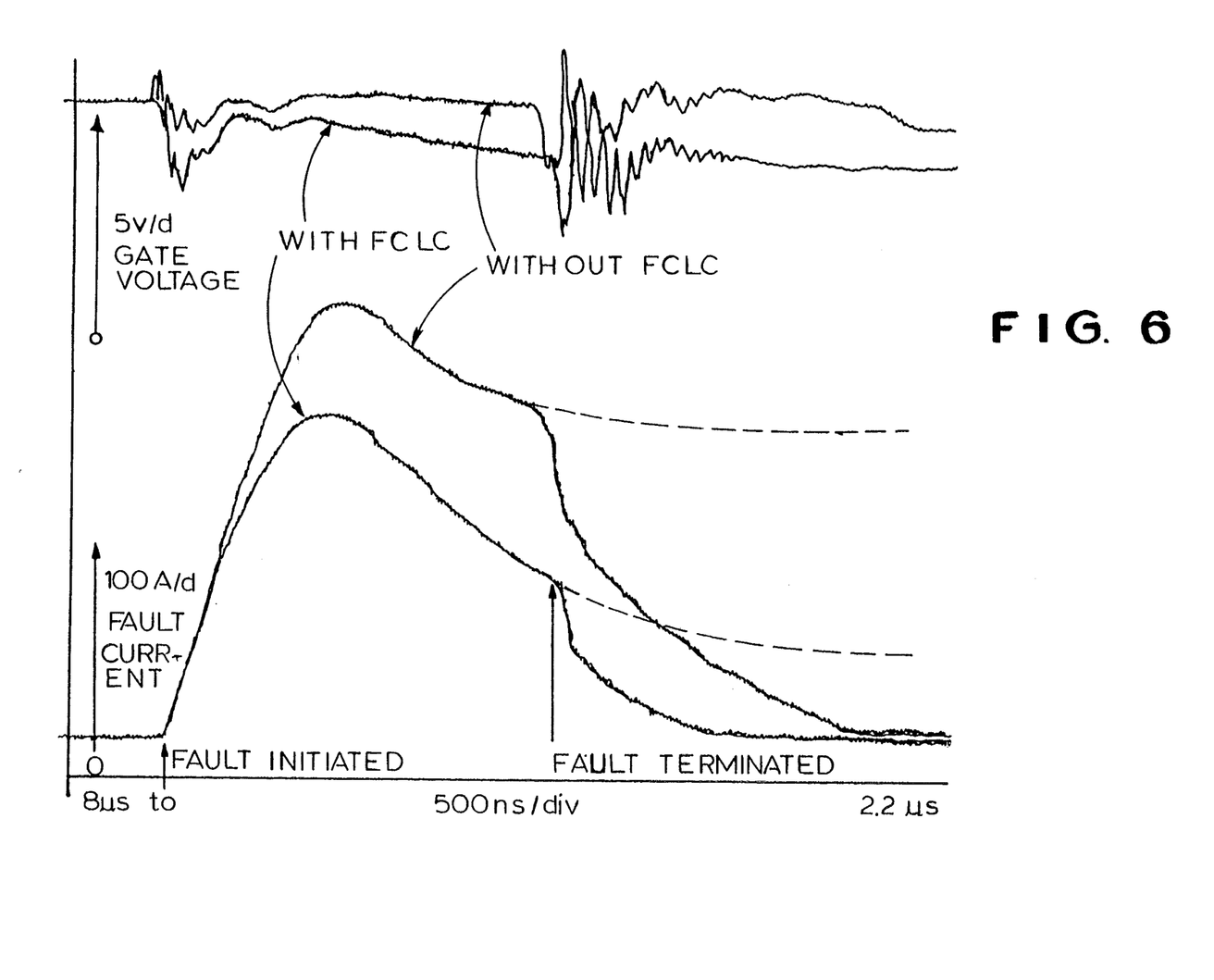
FIG. 6 shows waveforms demonstrating the differences in the magnitudes of fault currents with and without the circuit of the present invention.

With the MOSFET 14 fully turned on, the IGBT gate is clamped to the Zener voltage of Zener diode 13 (plus a small voltage drop across diode 15 and MOSFET 14). This clamp voltage is kept low enough to limit the fault current to a value specified by the short-circuit-safe-operating-area, SCSOA. If the fault occurs while the device is in conduction, the rise in collector voltage would couple a capacitive current from the collector to the gate. This effect, also known as the "Miller effect" causes the gate voltage to rise well above the normal gate drive voltage and forces much higher magnitude of fault current through the IGBT. The circuit of the invention will minimize this adverse effect. The waveforms shown in FIG. 6 demonstrate the differences in the magnitudes of the fault currents with and without the circuit of the invention.

If the fault current is of short transient type, the circuit of the present invention advantageously restores the gate voltage and normal device operation continues unimpeded.

Figure 7:
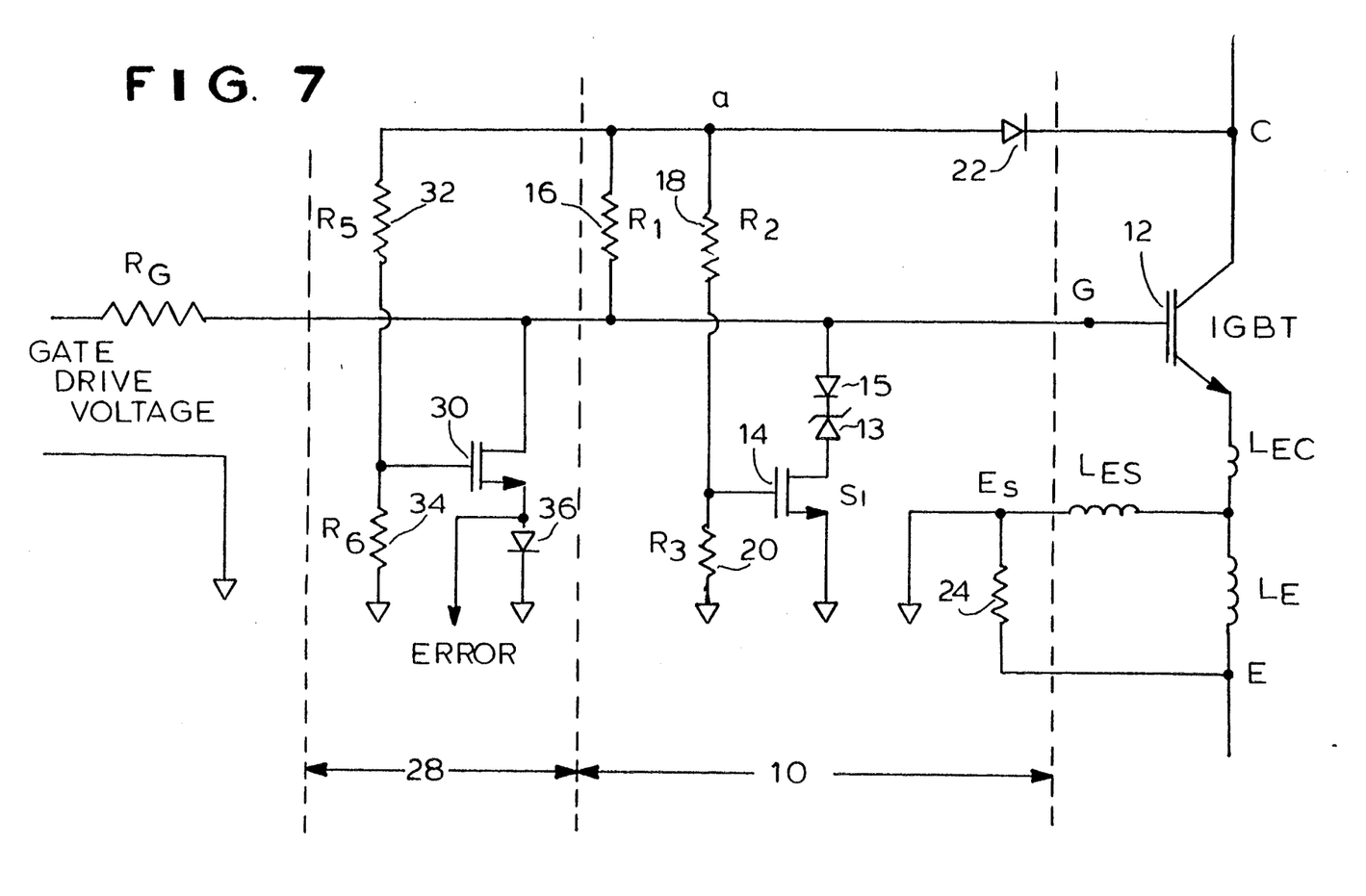
FIG. 7 shows an alternative embodiment of the invention utilizing an additional MOSFET to turn the IGBT off completely if the short circuit condition lasts longer than a predetermined time interval.

An alternative embodiment of the present invention is shown in FIG. 7. In this embodiment, additional circuitry 28 consisting of an additional MOSFET 30 and a pair of voltage divider resistors 32, 34 (having resistances of R5 and R6, respectively) are provided. MOSFET 30 turns IGBT 12 off completely if the fault lasts longer than a predetermined time interval as set by R1, R5, R6 and C2 (C2 being the gate capacitance of MOSFET 30). In such a case, the voltage drop across the PN junction of a diode 36 provided at the source of MOSFET 30 serves as an error flag, indicating fault. It should be noted that, when MOSFETs 14 and 30 are on, the dissipation in the gate driver is limited by the external series gate resister $R_G$.

Figure 8:
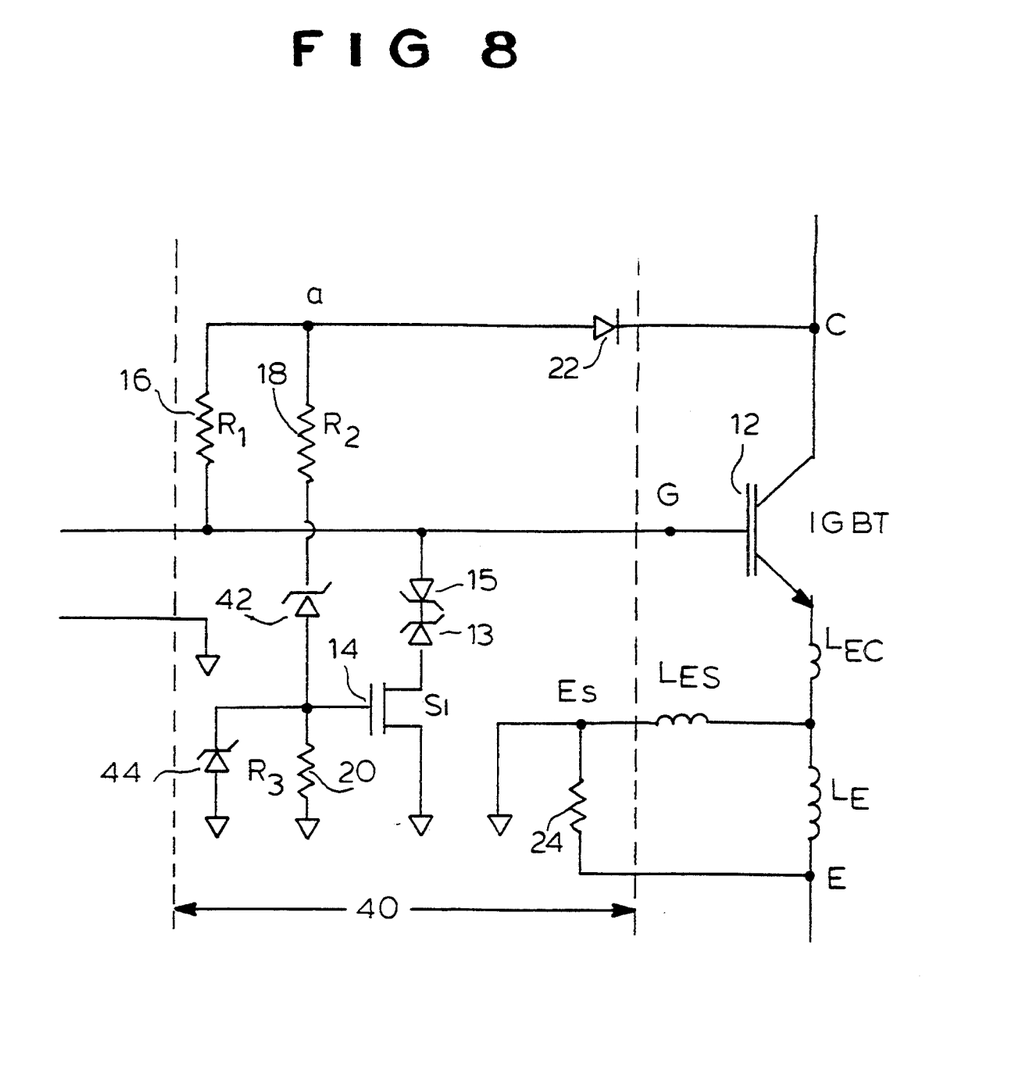
FIG. 8 shows another alternative embodiment of the invention in which a Zener diode is added to make the circuit more or less insensitive to variations in the on-state voltage drop of the IGBT and eliminate the need to select the MOSFET according to its gate-threshold voltage.

A further embodiment of the invention is shown in FIG. 8. The circuit of this embodiment, identified by reference numeral 40, requires two additional Zener diodes (identified by reference numerals 42 and 44), but eliminates the need to select MOSFET 14 according to its gate-threshold voltage. Thus, in the circuit of FIG. 5, MOSFET 14 must be selected to turn on above a particular voltage, that voltage being a fraction of the short circuit voltage at the collector of the IGBT 12. During normal conduction, the voltage at the collector of IGBT 12 depends upon the on-state voltage drop of the particular IGBT. However, by adding Zener diode 42 (and its associated voltage drop) as shown in FIG. 8, the voltage swing at the base of MOSFET 14 is increased such that, in the absence of a short circuit, only a fraction of a volt is present at the base of MOSFET 14. Thus, the circuit is less sensitive to variations in the on-state voltage drop of IGBT 12. Zener diode 44 is provided to protect the gate of MOSFET 14.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A fault current limiting circuit, comprising:
   (a) an IGBT to be protected, the IGBT having a gate, a collector and an emitter;
   (b) a MOS transistor for reducing the voltage applied to the gate of the IGBT during a short circuit condition, thereby lowering the short circuit current passing through the IGBT, the MOS transistor comprising a MOSFET having a gate, a drain and a source; and
   (c) means for applying an increased voltage to the gate of the MOSFET to turn the MOSFET on during a short circuit condition, comprising:
      (i) a potential divider coupled between the gate of the IGBT and the gate of the MOSFET; and
      (iii) a diode coupled between the potential divider and the collector of the IGBT, the diode being oriented so as to be rendered non-conductive during a short circuit condition when the voltage at the collector of the IGBT rises, resulting in an increased voltage at the gate of the MOSFET as current is prevented from passing through the diode and is diverted to the potential divider.

2. A circuit as recited in claim 1, further comprising a voltage clamping device coupled between the MOS transistor and the gate of the IGBT, the voltage clamping device clamping the voltage of the gate of the IGBT to a predetermined voltage when the MOS transistor is turned on during a short circuit condition.

3. A circuit as recited in claim 2, wherein the voltage clamping device comprises a Zener diode.

4. A circuit as recited in claim 1, wherein the current diverted to the potential divider is generated from the voltage supplied to the gate of the IGBT.

5. A circuit as recited in claim 4, further comprising an additional MOSFET and an additional potential divider coupled between the gate of the IGBT and the diode for turning the IGBT off completely if the short circuit condition lasts longer than a predetermined time interval.

6. A circuit as recited in claim 5, further comprising a diode coupled between the source of the additional MOSFET and ground for providing an error flag indicating the short circuit condition.

7. A circuit as recited in claim 4, further comprising a Zener diode coupled between the gate of the MOSFET and the potential divider.

8. A method for improving the short circuit withstand capability of an IGBT, the IGBT having a gate, a collector and an emitter, the method comprising the steps of:
   (a) detecting the occurrence of a short circuit condition by using a diode coupled to the collector of the IGBT, the diode being oriented so as to be rendered non-conductive during a short circuit condition when the voltage at the collector of the IGBT rises; and
   (b) activating a MOS transistor to reduce the voltage applied to the gate of the IGBT during a short circuit condition, thereby lowering the short circuit current passing through the IGBT;
   wherein
      (i) the MOS transistor comprises a MOSFET having a gate, a source and a drain;
      (ii) a potential divider is coupled between the gate of the IGBT and the gate of the MOSFET, and
      (iii) the diode is coupled between the potential divider and the collector of the IGBT, such that during a short circuit condition when the voltage at the collector of the IGBT rises and the diode is non-conductive, an increased voltage is generated at the gate of the MOSFET as current is prevented from the diode and is diverted through the potential divider.

9. A method as recited in claim 8, further comprising the step of clamping the voltage of the gate of the IGBT to a predetermined voltage when the MOS transistor is turned on during a short circuit condition.

10. A method as recited in claim 8, wherein the current diverted to the potential divider is generated from the voltage supplied to the gate of the IGBT.

11. A method as recited in claim 9, further comprising the step of turning the IGBT off completely if the short circuit condition lasts longer than a predetermined time interval.

12. A method as recited in claim 9, further comprising the step of providing an error flag indicating the short circuit condition.

13. A circuit as recited in claim 1, wherein the MOSFET has an input capacitance and the potential divider has a resistance, the resistance of the potential divider combining with the input capacitance of the MOSFET to form a time constant for preventing false triggering of the MOSFET by switching transients.

14. A method as recited in claim 10, wherein the MOSFET has an input capacitance and the potential divider has a resistance, the resistance of the potential divider combining with the input capacitance of the MOSFET to form a time constant for preventing false triggering of the MOSFET by switching transients.

* * * * *